United States Patent
Shilling et al.

(10) Patent No.: US 8,228,679 B2
(45) Date of Patent: Jul. 24, 2012

(54) CONNECTIONS FOR ELECTRONIC DEVICES ON DOUBLE-SIDED CIRCUIT BOARD

(75) Inventors: Thomas H. Shilling, San Jose, CA (US); Todd Snider, Gilbert, AZ (US); Melissa Grupen-Shemansky, Los Gatos, CA (US)

(73) Assignee: Spansion LLC, Sunnyvale, CA (US)

( * ) Notice: Subject to any disclaimer, the term of this patent is extended or adjusted under 35 U.S.C. 154(b) by 890 days.

(21) Appl. No.: 12/080,311

(22) Filed: Apr. 2, 2008

(65) Prior Publication Data
US 2009/0250255 A1    Oct. 8, 2009

(51) Int. Cl.
*H05K 1/18* (2006.01)

(52) U.S. Cl. ........ 361/760; 361/764; 361/767; 361/766; 361/777; 361/782; 257/686; 257/698; 257/77; 257/778; 174/260; 174/261; 174/262; 438/106; 438/108

(58) Field of Classification Search .................. 361/760, 361/761, 762, 764, 766, 774, 777, 783, 784, 361/772, 773, 779, 782, 811, 820, 821; 174/260, 174/261, 262, 250, 265; 257/668, 686, 678, 257/690–691, 679, 723, 777, E23.173, 774, 257/724, 738, 779, 782; 439/567, 68, 82; 438/107, 108, 118, 584; 29/830, 840, 842, 29/852, 846, 890
See application file for complete search history.

(56) References Cited

U.S. PATENT DOCUMENTS

| | | | | |
|---|---|---|---|---|
| 4,774,632 A | * | 9/1988 | Neugebauer | 361/715 |
| 4,994,896 A | * | 2/1991 | Uemura et al. | 257/724 |
| 5,252,857 A | * | 10/1993 | Kane et al. | 257/686 |
| 5,254,016 A | * | 10/1993 | Ganthier | 439/567 |
| 5,303,120 A | * | 4/1994 | Michii et al. | 361/760 |
| 5,815,372 A | * | 9/1998 | Gallas | 361/760 |
| 5,821,614 A | * | 10/1998 | Hashimoto et al. | 257/679 |
| 5,982,633 A | * | 11/1999 | Jeansonne | 361/782 |
| 6,008,987 A | * | 12/1999 | Gale et al. | 361/700 |
| 6,104,088 A | * | 8/2000 | Hatano et al. | 257/698 |
| 6,200,830 B1 | * | 3/2001 | Ito et al. | 438/106 |
| 6,424,034 B1 | * | 7/2002 | Ahn et al. | 257/723 |
| 6,433,422 B1 | * | 8/2002 | Yamasaki | 257/725 |
| 6,434,016 B2 | * | 8/2002 | Zeng et al. | 361/760 |
| 6,490,188 B2 | * | 12/2002 | Nuxoll et al. | 365/63 |
| 6,713,854 B1 | * | 3/2004 | Kledzik et al. | 257/686 |

(Continued)

FOREIGN PATENT DOCUMENTS
JP    359039057 A  *  3/1984
(Continued)

OTHER PUBLICATIONS

English translation of the Japan Patent JP409186424A by Hatsupouya—6 pages.*

Primary Examiner — Michail V Datskovskiy (57) ABSTRACT

In the present electronic structure, a substrate is provided in the form of a circuit board. First and second electronic devices are positioned on opposite sides of the circuit board, each having a plurality of contacts connected to the circuit board. Each of the contacts of the first device is connected to a contact of the second device by a connector though the circuit board. At least one of the contacts of the first device is connected to the contact of the second device which is most adjacent to that contact of the first device across the circuit board.

15 Claims, 8 Drawing Sheets

U.S. PATENT DOCUMENTS

| | | | |
|---|---|---|---|
| 6,862,192 B2 * | 3/2005 | Yashiro | 361/803 |
| 6,943,454 B1 * | 9/2005 | Gulachenski et al. | 257/777 |
| 6,992,940 B1 * | 1/2006 | Tauber | 365/202 |
| 7,061,092 B2 * | 6/2006 | Akram et al. | 257/690 |
| 7,062,117 B2 * | 6/2006 | Uchida | 385/14 |
| 7,087,988 B2 * | 8/2006 | Hosomi | 257/686 |
| 7,161,821 B2 * | 1/2007 | Martin et al. | 365/63 |
| 7,289,332 B2 * | 10/2007 | Clark | 361/783 |
| 7,365,438 B2 * | 4/2008 | Hedler et al. | 257/778 |
| 7,405,366 B2 * | 7/2008 | Shioga et al. | 174/260 |
| 7,525,817 B2 * | 4/2009 | Yashiro | 361/803 |
| 7,642,635 B2 * | 1/2010 | Kikuchi et al. | 257/686 |

FOREIGN PATENT DOCUMENTS

| | | | |
|---|---|---|---|
| JP | 360200559 A | * | 10/1985 |
| JP | 409186424 A | * | 7/1997 |
| JP | 02003168852 A | * | 6/2003 |

* cited by examiner

CONNECTIONS FOR ELECTRONIC DEVICES ON DOUBLE-SIDED CIRCUIT BOARD

BACKGROUND OF THE INVENTION

1. Technical Field

This invention relates generally to electronic devices, and more particularly, to an approach for connecting electronic devices on opposite sides of a circuit board.

2. Background Art

Figure 1:
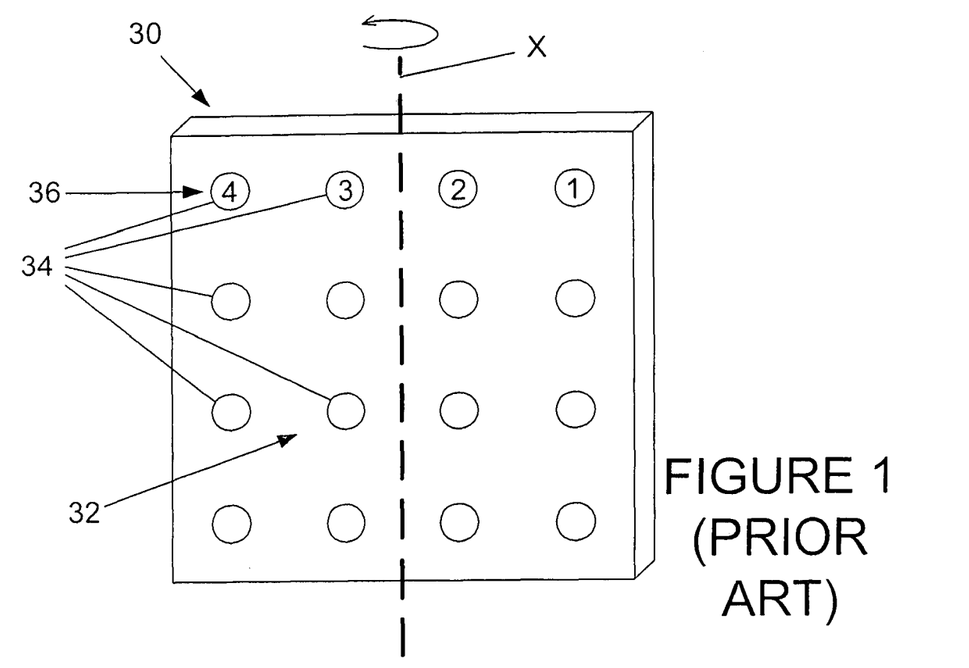
FIG. 1 is a perspective view of a prior art packaged semiconductor device.

FIG. 1 illustrates an electronic device in the form of a packaged semiconductor device 30. The device 30 includes a ball grid array 32 on one side thereof (shown on the side of the device 30 facing the viewer of FIG. 1), with the number of balls of the array shown greatly reduced for clarity. The ball grid array includes a plurality of conductive balls which make up contacts formed in rows, patterns or other arrangements. In this embodiment, rows are depicted For example, the row 36 of contacts 34 includes contacts 34-4, 34-3, 34-2, 34-1 (reading from left to right in FIG. 1). The contacts 34 communicate with a semiconductor chip (not shown) inside the package, as is well known.

Figure 2:
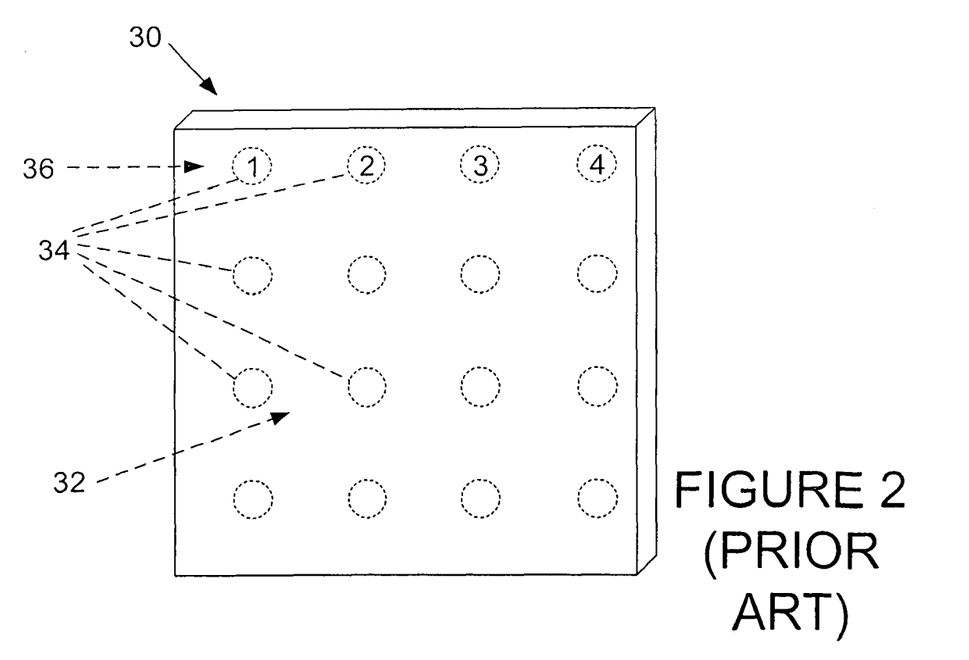
FIG. 2 is a view of the device of FIG. 1 rotated 180 degrees about the axis X shown in FIG. 1.

FIG. 2 illustrates the device 30 of FIG. 1 rotated 180 degrees about the axis X shown in FIG. 1. As such, the contacts 34 are now on the side of the device 30 facing away from the viewer of FIG. 2, and the order of the contacts in row 36 (again reading from left to right in FIG. 2) is reversed relative to FIG. 1.

Figure 3:
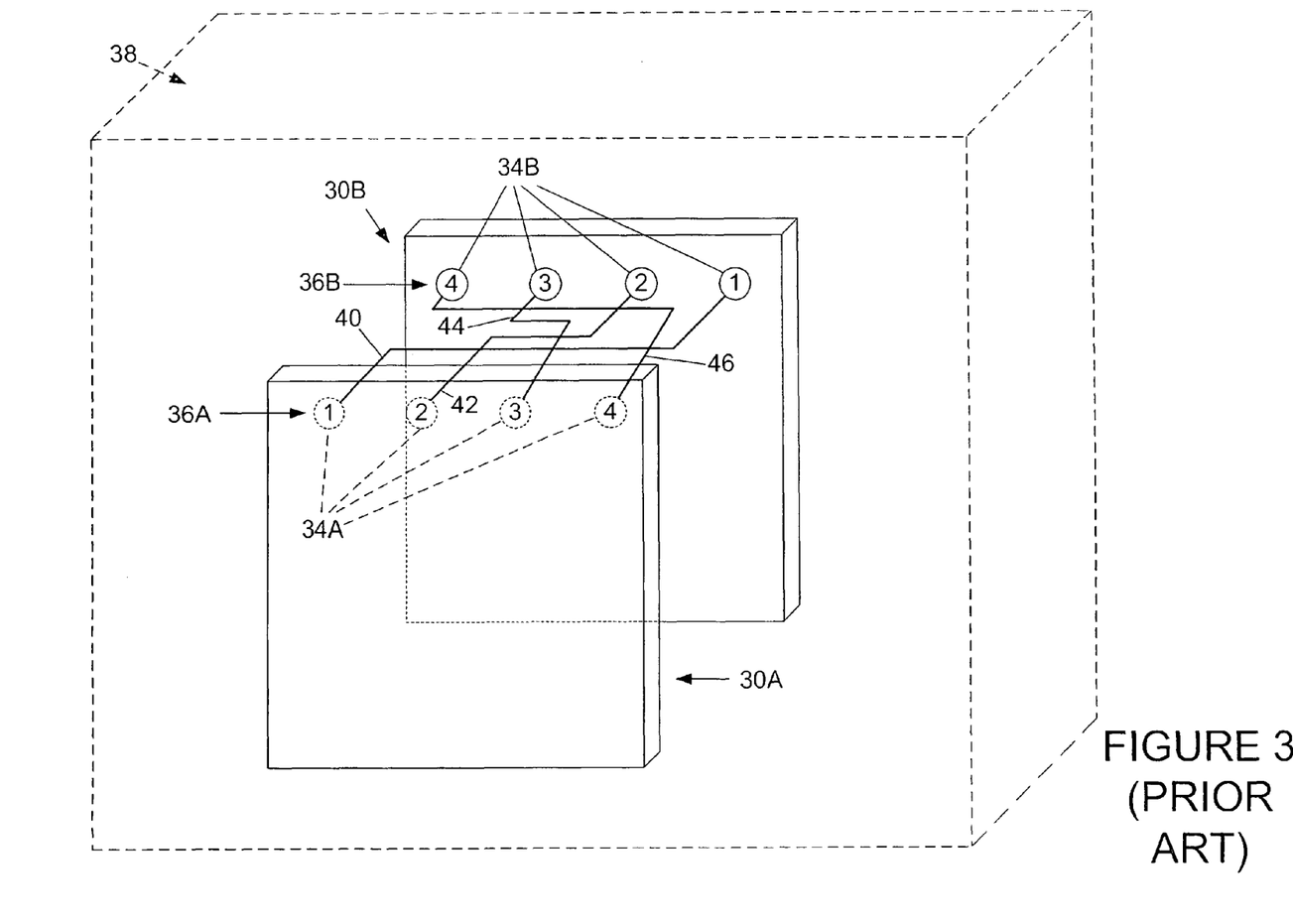
FIG. 3 is a perspective view of the prior art mounting of electronic devices on opposite sides of a circuit board.
Figure 4:
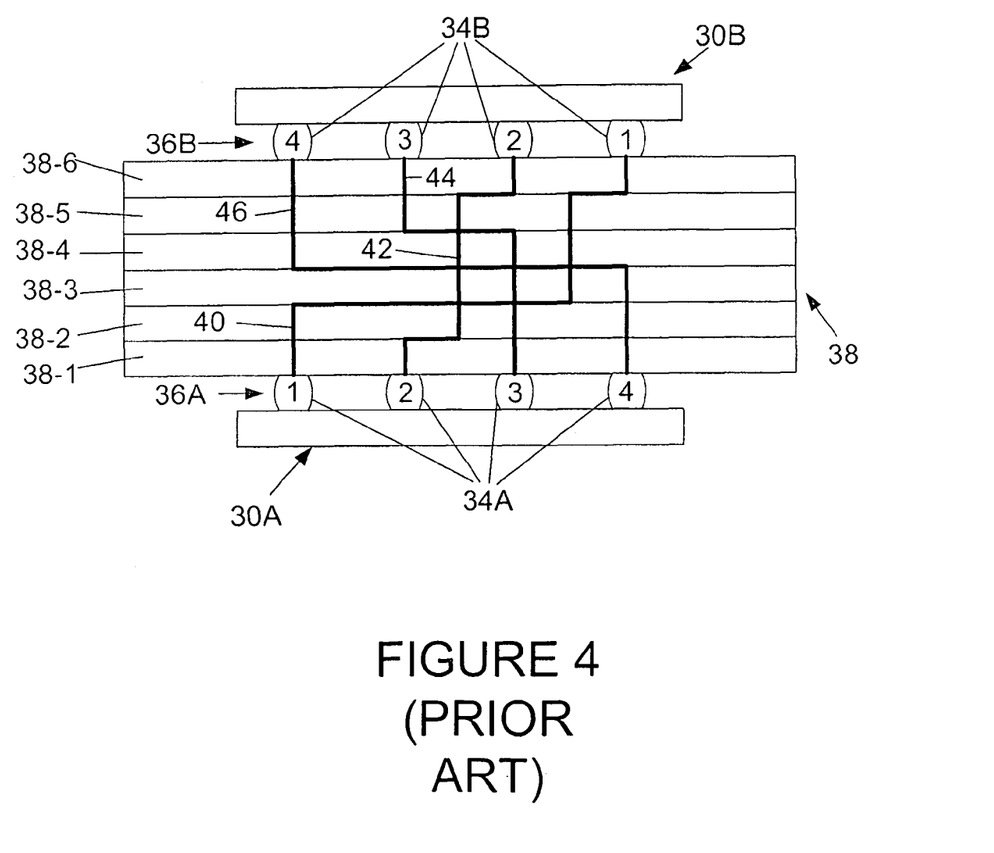
FIG. 4 is a sectional view of the structure of FIG. 3 showing the connections between contacts of the packaged semiconductor devices.

With reference to FIG. 3, many of today's electronic systems utilize double-sided circuit boards with electronic devices mounted on both sides of the board, with the contacts thereof connected to traces on the circuit board. Each contact of one device is connected to a chosen contact of the device on the other side by means of a conductive connection passing through the circuit board. Signals which may be transferred from one device to another through the circuit board may include input/output signals (including, but not limited to, address signals, data signals, power and ground connections, clock signals, etc). In the present example, it may be desirable to connect identical devices 30A, 30B (each identical to the device 30 of FIGS. 1 and 2) through the circuit board 38, with corresponding contacts of the devices 30A, 30B connected. That is, for example, contact 34A-1 of device 30A is to be connected to contact 34B-1 of device 30B, contact 34A-2 of device 30A is to be connected to contact 34B-2 of device 30B, contact 34A-3 of device 30A is to be connected to contact 34B-3 of device 30B, and contact 34A-4 of device 30A is to be connected to contact 34B-4 of device 30B. These connections 40, 42, 44, 46 are shown in schematic form in FIG. 3. FIG. 4 illustrates the actual complexity of making these connections. The layers 38-1, 38-2, 38-3, 38-4, 38-5, 38-6 of the circuit board 38, as shown in FIG. 4, must have formed therein complex passages from one side to the other for provision of the conductive connectors 40, 42, 44, 46 therethrough so as to make appropriate connection as specified above. Individual portions of the connectors must be formed layer-by-layer and must of course be very accurately placed. This, along with the need for multiple layers for the circuit board 38, greatly increases the complexity and cost of the overall electronic structure.

One way of mirroring and matching front-side contacts with back-side contacts is to mirror the component die pad orientations on the semiconductor chip. However, present chip mask costs, even for only a partial mask set change, make this option prohibitively costly.

Another possible solution involves mirroring the package contact positioning. However, simply mirroring the package contact positioning with no modifications to the chip bond pad layout can detrimentally affect package signal integrity, and thus product performance.

Therefore, what is needed is an approach which overcomes these problems by greatly simplifying the connections as described above through the circuit board.

DISCLOSURE OF THE INVENTION

Broadly stated, the present electronic structure comprises a substrate, first and second electronic devices positioned on opposite sides of the substrate, the first electronic device having a first plurality of contacts, the second electronic device having a second plurality of contacts, a first contact of the first plurality thereof being connected to a first contact of the second plurality thereof by a connector through the substrate, wherein the first contact of the second plurality thereof is the contact of the second plurality thereof which is most adjacent the first contact of the first plurality thereof.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Figure 5:
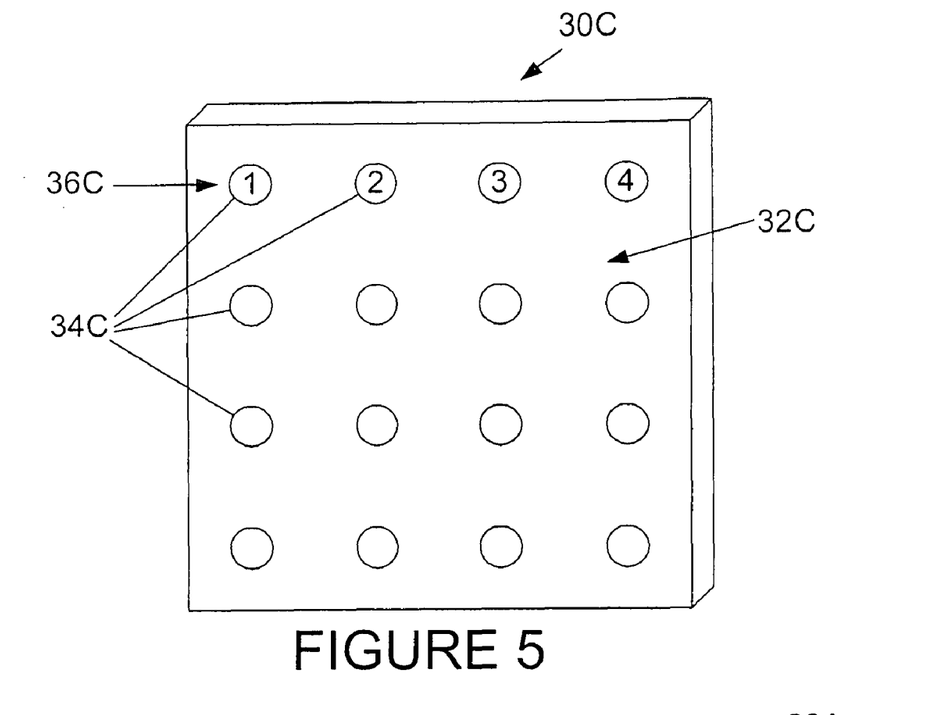
FIGS. 5 and 6 illustrate variations in the packaged semiconductor device.
Figure 6:
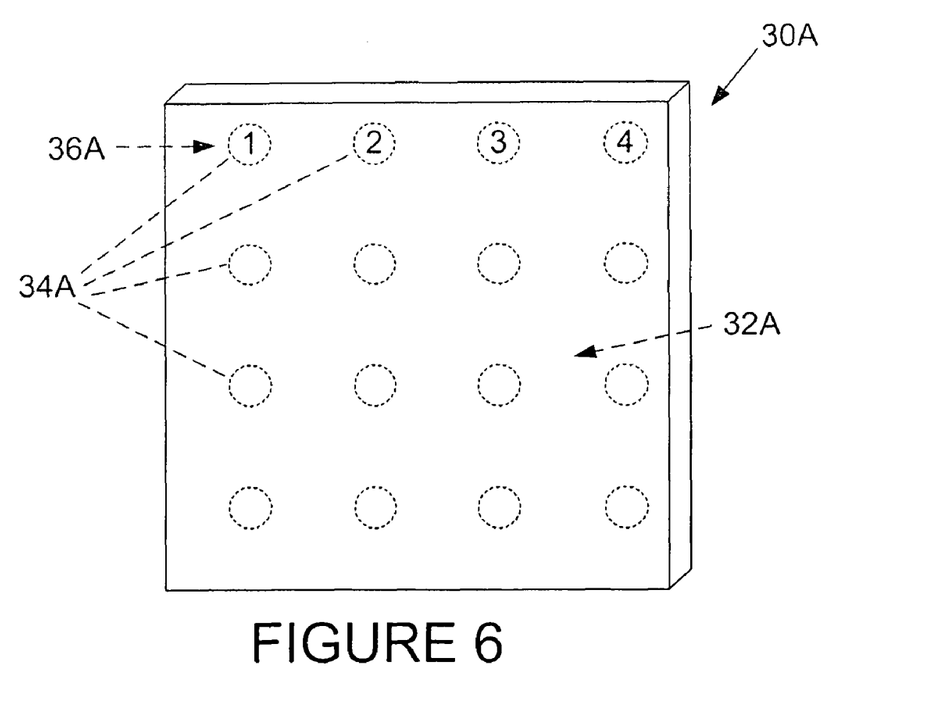

Reference is now made in detail to specific embodiments of the present invention which illustrate the best mode presently contemplated by the inventors for practicing the invention. FIGS. 5 and 6 illustrate packaged semiconductor devices. FIG. 6 illustrates a device identical to device 30A shown in FIG. 3 and device 30 in FIGS. 1 and 2. As such, the device 30A includes a ball grid array 32A on one side thereof (shown on the side of the device 30 facing away from the viewer of FIG. 6), with the number of balls of the array shown greatly reduced for clarity. The ball grid array 32A includes a plurality of conductive balls which make up contacts formed in rows. For example, the row 36A of contacts 34A includes contacts 34A-1, 34A-2, 34A-3, 34A-4 (reading from left to right in FIG. 6). The contacts 34A communicate with a semiconductor chip (not shown) inside the package, as is well known.

FIG. 5 illustrates a device 30C like device 30A shown in FIG. 3 and device 30 in FIGS. 1 and 2. As such, the device 30C includes a ball grid array 32C on one side thereof (shown on the side of the device 30C facing the viewer of FIG. 5). The ball grid array 32C includes a plurality of conductive balls which make up contacts formed in rows. The contacts 34C communicate with a semiconductor chip (not shown) inside the package, as is well known. However, the order of contacts in the row 36C of device 30C is reversed as compared device 30B of FIG. 3, by rerouting the internal connections of the device 30B to these contacts. For example, the row 36C of contacts 34C includes contacts 34C-1, 34C-2, 34C-3, 34C-4 (reading from left to right in FIG. 5).

Figure 7:
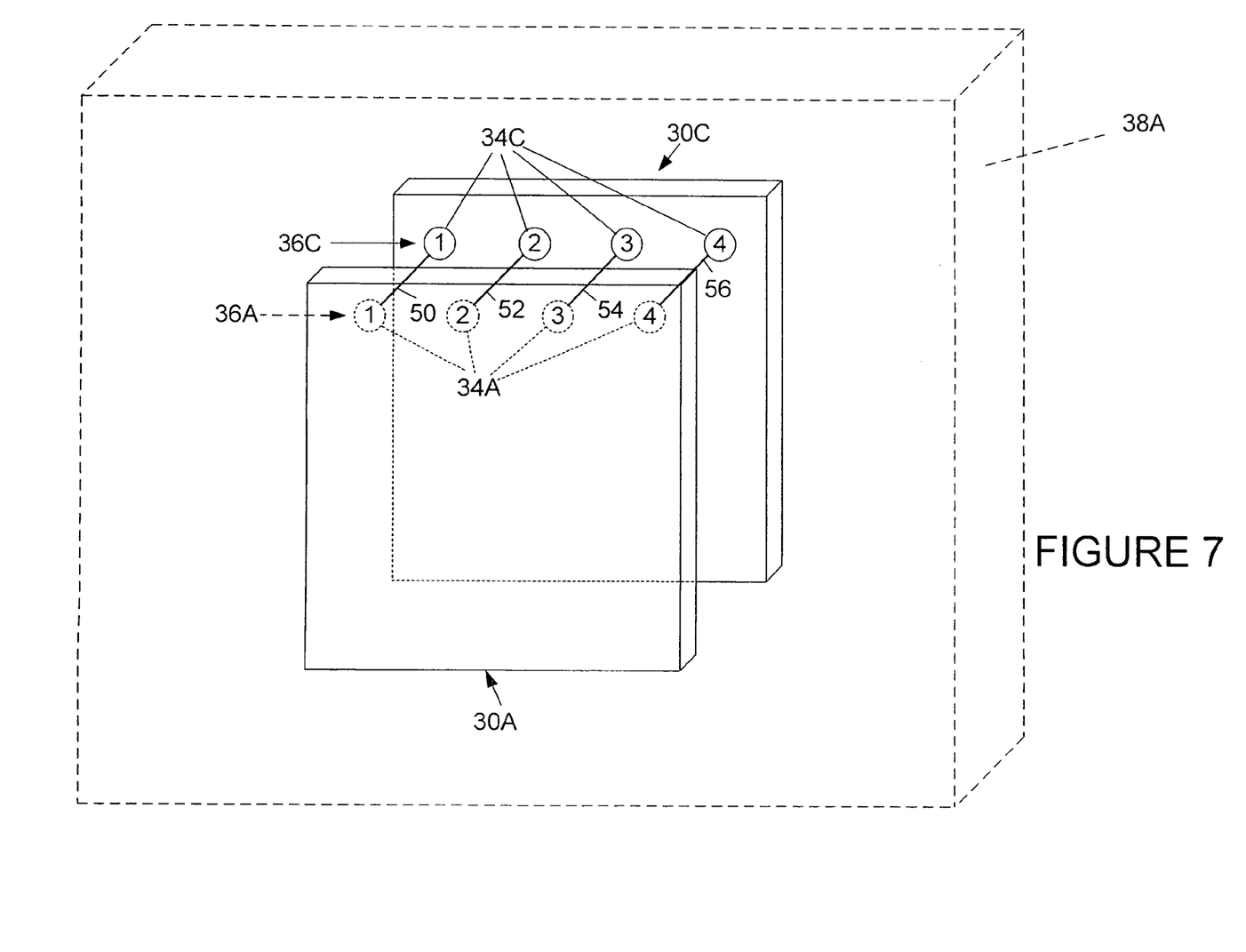
FIG. 7 is a perspective view showing the mounting of the electronic devices of FIGS. 5 and 6 on opposite sides of a circuit board.

As shown in FIG. 7, the device 30A is provided on one side of a substrate in the form of a circuit board 38A, and the device 30C is provided on the opposite of the circuit board 38A, directly across from the device 30A. Each of these devices is connected to circuit board 38A in a well known manner. Similar to the prior art, corresponding contacts of the devices 30A, 30C are to be connected. That is, for example, contact 34A-1 of device 30A is to be connected to contact 34C-1 of device 30C, contact 34A-2 of device 30A is to be connected to contact 34C-2 of device 30C, contact 34A-3 of device 30A is to be connected to contact 34C-3 of device 30C, and contact 34A-4 of device 30A is to be connected to contact 34C-4 of device 30C. These connections 50, 52, 54, 56 are shown in schematic form in FIG. 7.

The reordering of the contacts 34C-1, 34C-2, 34C-3, 34C-4 places contact 34A-1 of the device 30A directly across the circuit board 38A from contact 34C-1 of the device 30C, contact 34A-2 of the device 30A directly across the circuit board 38A from contact 34C-2 of the device 30C, contact 34A-3 of the device 30A directly across the circuit board 38A from contact 34C-3 of the device 30C, and contact 34A-4 of the device 30A directly across the circuit board 38A from contact 34C-4 of the device 30C.

Figure 8:
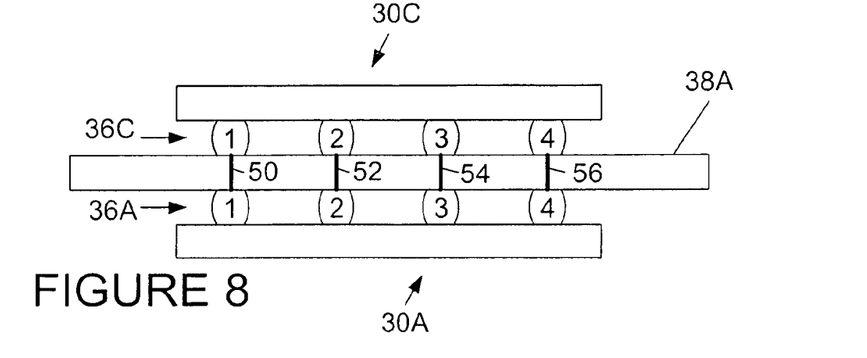
FIG. 8 is a sectional view of the structure of FIG. 7.

In such case, the contacts most adjacent each other across the circuit board 38A, indeed those pairs of contacts directly across the circuit board from each other, may be directly connected by a straight conductor passing through the circuit board 38A. Thus, straight conductor 50 connects contact 34A-1 with contact 34C-1, straight conductor 52 connects contact 34A-2 with contact 34C-2, straight conductor 54 connects contact 34A-3 with contact 34C-3, and straight conductor 56 connects contact 34A-4 with contact 34C-4. In such case (FIG. 8), the circuit board 38A may be only a single layer, greatly simplifying the construction thereof. There are no conductors which cross over one another as in the prior art, greatly simplifying the connection process, and no complex passages are required through the circuit board 38A for the connections.

FIGS. 9-12 illustrate a second embodiment of the invention. Key to this approach is identifying those contacts that can make use of straight conductors to interconnect frontside packages to backside packages. These important contacts should be located toward the center of the ball grid array 32 in FIG. 9 for several reasons. First, locating the contacts geometrically toward the center of the array around an axis of symmetry X as in FIG. 1 minimizes the effect on the rerouted internal device connections and the resultant device electrical parasitics. Second, circuit board straight conductors are clustered toward the center of the frontside and backside packages allowing for peripheral escape of connections through the circuit board that are unique and necessarily isolated from other interconnects. Combined, this approach can both minimize system costs and preserve packaged semiconductor device and system signal integrity.

Figure 9:
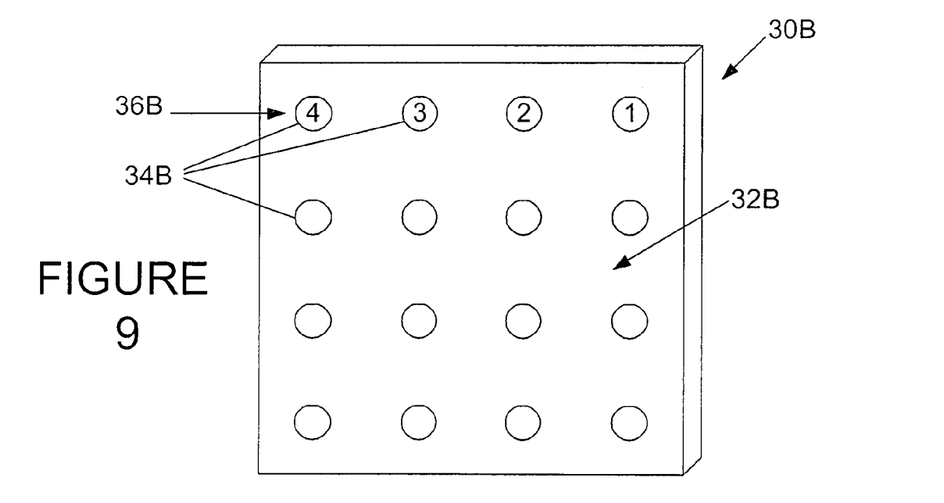
FIGS. 9 and 10 illustrate further variations in the packaged semiconductor device.
Figure 10:
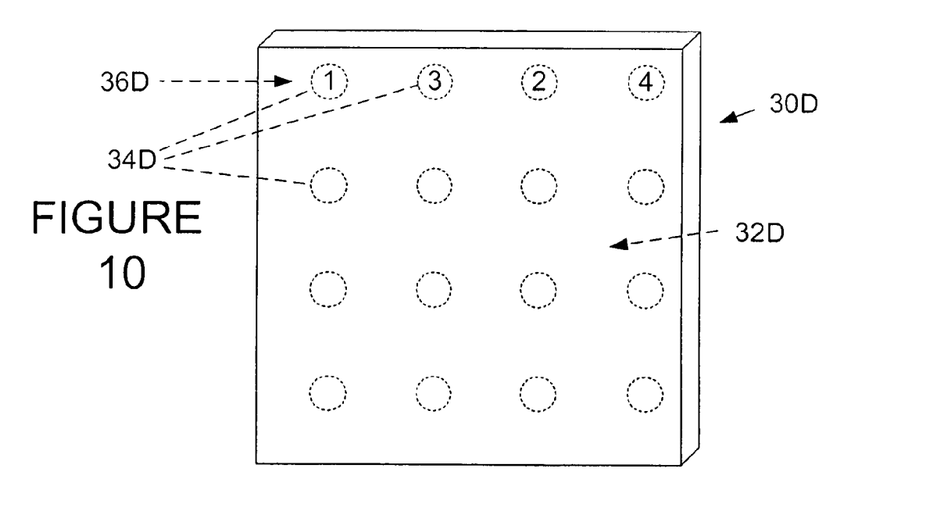
Figure 11:
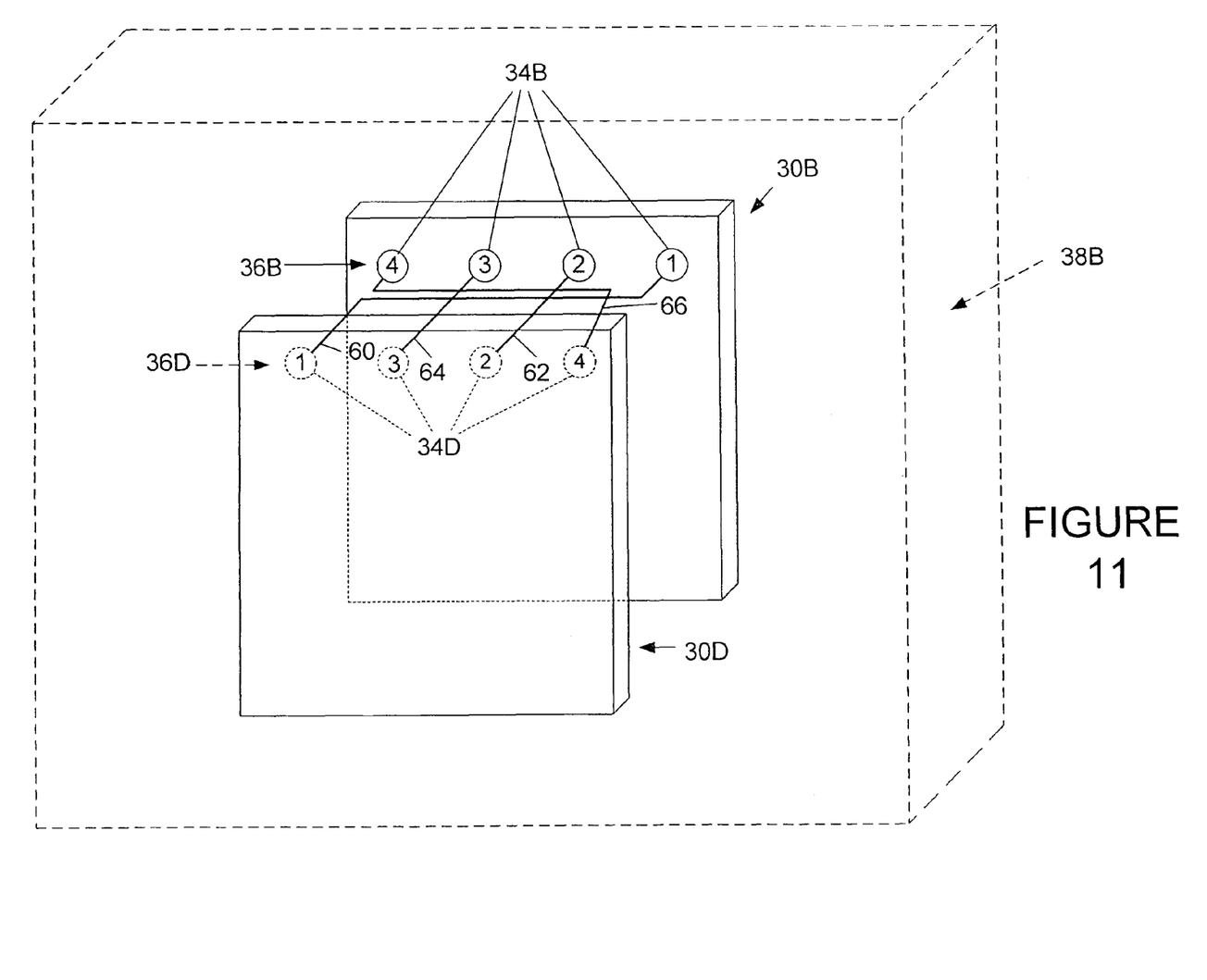
FIG. 11 is a perspective view showing the mounting of the electronic devices of FIGS. 9 and 10 on opposite sides of a circuit board.
Figure 12:
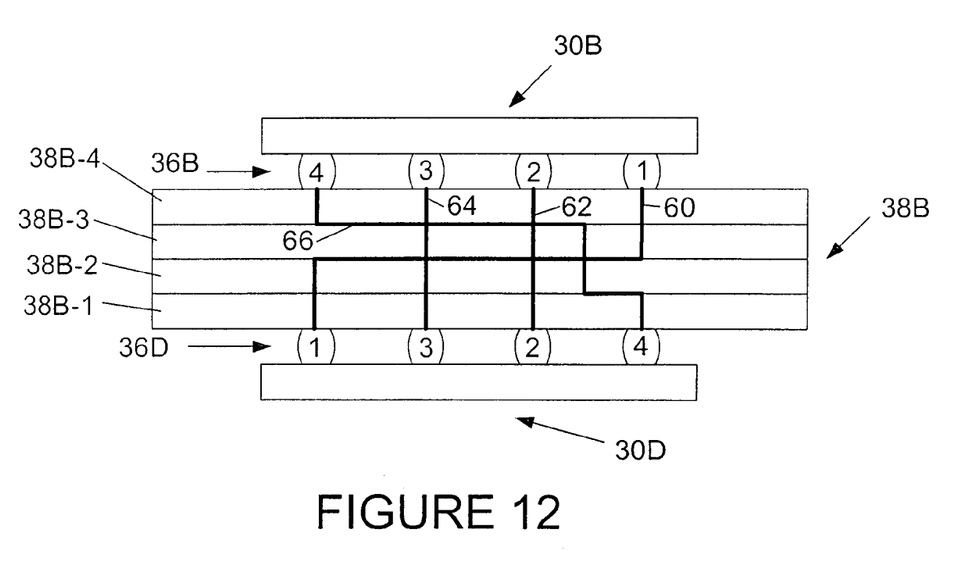
FIG. 12 is a sectional view of the structure of FIG. 11 showing the connections between contacts of the packaged semiconductor devices.

FIG. 9 illustrates a device 30B similar to that shown in FIG. 3, while the device 30D of FIG. 10 has the contacts in the order 34D-1, 34D-3, 34D-2, 34D-4 (left to right in viewing FIG. 11), so that when the packaged semiconductor devices 30B, 30D are placed on opposite sides of the circuit board 38B (FIG. 11), contact 34D-3 of the packaged semiconductor device 30D is directly across the circuit board 38B from contact 34B-3 of the packaged semiconductor device 30B, while contact 34D-2 of the packaged semiconductor device 30D is directly across the circuit board 38B from contact 34B-2 of the packaged semiconductor device 30B (again achieved by rerouting the internal connections of the device 30B to these contacts). In such case, direct connections can be made between the contacts 34D-3, 34B-3 and between the contacts 34D-2, 34B-2. Even though connection between the contact 34D-1 and the contact 34B-1 cannot be made directly, and connection between the contact 34D-4 and the contact 34B-4 cannot be made directly, the circuit board 38B through which these connectors pass can include fewer layers and is greatly simplified in the formation of vias through which the conductors are disposed (FIGS. 11 and 12). In this embodiment the circuit board 38B is shown with four layers 38B-1, 38B-2, 38B-3, 38B-4.

As illustrated and described, only a subset of the total I/O can take advantage of the simplified circuit board routing by mirroring front-of-board and back-of-board packaged semiconductor devices. A key aspect in this embodiment is locating the critical contacts that will be mirrored toward the center of the ball grid array around an axis of rotation so as to minimize the effects on package signal integrity while preserving the lower system costs.

As will be seen, compared to the prior art routing technique, the present approach allows for fewer circuit board layers and elimination of expensive, complicated vias or passages in the circuit board, which reduces circuit board cost. The circuit board can be made thinner, important in height sensitive applications. Shorter, straighter conductors in the circuit board improve electrical performance by reducing resistance, impedance and signal cross talk.

The present concept can be applied to virtually any semiconductor package including, but not limited to, plastic ball grid array packages, land grid array packages, lead frame packages, and wafer-level chip scale packages.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic device comprising:
a substrate;
first and second electronic devices positioned on opposite sides of the substrate;
the first electronic device having a first plurality of contacts;
the second electronic device having a second plurality of opposite contacts;
a contact of the first plurality of contacts being connected to a contact of the second plurality of opposite contacts by a connector through the substrate;
wherein the contact of the second plurality of opposite contacts is the contact of the second plurality of opposite contacts which is most adjacent the contact of the first plurality of contacts, wherein a portion of an order of contacts of the first plurality of contacts is reversed in relation to a portion of an order of contacts of the second plurality of opposite contacts, and wherein the portion of the first plurality of contacts with reversed order are arranged together towards a center of an arrangement of the first plurality of contacts.

2. The electronic device of claim 1 wherein the contact of the first plurality of contacts is directly across from the contact of the second plurality of opposite contacts.

3. The electronic device of claim 1 wherein the connector is straight in configuration.

4. The electronic device of claim 1 wherein the substrate is a circuit board.

5. The electronic device of claim 4 wherein the circuit board is a multi-layer circuit board.

6. The electronic device of claim 1 wherein the first plurality of contacts of the first electronic device are arranged in a row, and the second plurality of opposite contacts of the second electronic device are arranged in a row.

7. The electronic device of claim 1, wherein each contact of the portion of contacts of the first plurality of contacts that are of reversed order are connected to a corresponding contact of the second plurality of opposite contacts directly across the substrate by straight connectors.

8. The electronic device of claim 1, wherein the portion of an order of contacts of the first plurality of contacts is reversed in relation to the portion of an order of contacts of the second plurality of opposite contacts, such that a second portion of the contacts of the first plurality of contacts is unreversed in relation to the order of contacts of the second plurality of opposite contacts.

9. An electronic structure comprising:
a substrate;
first and second electronic devices positioned on opposite sides of the substrate;
the first electronic device having a first plurality of contacts;
the second electronic device having a second plurality of opposite contacts;
each contact of the first plurality of contacts being connected to a contact of the second plurality of opposite contacts across the substrate by a connector, wherein a portion of an order of contacts of the first plurality of contacts is reversed in relation to a portion of an order of contacts of the second plurality of opposite contacts, and wherein the portion of the first plurality of contacts with reversed order are arranged together towards a center of an arrangement of the first plurality of contacts.

10. The structure of claim 9 wherein each connector connecting a contact of the portion of the first plurality of contacts with reversed order to a contact of the portion of the second plurality of opposite contacts is straight in configuration.

11. The structure of claim 10 wherein the substrate is a circuit board.

12. The structure of claim 11 wherein the circuit board is a multilayer circuit board.

13. The structure of claim 11 wherein the plurality of contacts of the first electronic device are arranged in a plurality of rows, and the plurality of opposite contacts of the second electronic device are arranged in a plurality of rows.

14. The structure of claim 12 wherein the first and second electronic devices are substantially identical devices but with different contact orderings.

15. The structure of claim 9, wherein the portion of an order of contacts of the first plurality of contacts is reversed in relation to the portion of an order of contacts of the second plurality of opposite contacts, such that a second portion of the contacts of the first plurality of contacts is unreversed in relation to the order of contacts of the second plurality of opposite contacts.

* * * * *